US007830493B2

(12) United States Patent
Tinnemans et al.

(10) Patent No.: US 7,830,493 B2
(45) Date of Patent: Nov. 9, 2010

(54) SYSTEM AND METHOD FOR COMPENSATING FOR RADIATION INDUCED THERMAL DISTORTIONS IN A SUBSTRATE OR PROJECTION SYSTEM

(75) Inventors: Patricius Aloysius Jacobus Tinnemans, Hapert (NL); Willem Jurrianus Venema, Eindhoven (NL); Koen Jacobus Johannes Maria Zaal, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 825 days.

(21) Appl. No.: 11/257,399

(22) Filed: Oct. 25, 2005

(65) Prior Publication Data

US 2007/0076180 A1 Apr. 5, 2007

Related U.S. Application Data

(60) Provisional application No. 60/722,950, filed on Oct. 4, 2005.

(51) Int. Cl.
*G03B 27/52* (2006.01)
(52) U.S. Cl. .......................................... 355/30
(58) Field of Classification Search ................... 355/30, 355/53, 72–74
See application file for complete search history.

(56) References Cited

U.S. PATENT DOCUMENTS

| 4,668,077 A | * | 5/1987 | Tanaka ........................ 355/30 |
| 4,669,842 A | * | 6/1987 | Yomoda et al. ............. 353/101 |
| 5,117,255 A | | 5/1992 | Shiraishi et al. |
| 5,229,872 A | | 7/1993 | Mumola |
| 5,296,891 A | | 3/1994 | Vogt et al. |
| 5,500,736 A | | 3/1996 | Koitabashi et al. |
| 5,523,193 A | | 6/1996 | Nelson |
| 5,530,482 A | | 6/1996 | Gove et al. |
| 5,579,147 A | | 11/1996 | Mori et al. |
| 5,581,324 A | * | 12/1996 | Miyai et al. ................. 355/53 |
| 5,610,965 A | * | 3/1997 | Mori et al. .................. 378/34 |
| 5,677,703 A | | 10/1997 | Bhuva et al. |

(Continued)

FOREIGN PATENT DOCUMENTS

EP 1 482 375 A2 12/2004

(Continued)

OTHER PUBLICATIONS

U.S. Appl. No. 11/257,398, filed Oct. 2005, Venema et al.

(Continued)

*Primary Examiner*—Peter B Kim
*Assistant Examiner*—Chia-how Michael Liu
(74) *Attorney, Agent, or Firm*—Sterne, Kessler, Goldstein & Fox P.L.L.C.

(57) ABSTRACT

A system and method are used to compensate for thermal effect on a lithographic apparatus. The system comprises a patterning device, a projection system, a substrate position controller, and a substrate-position-based expansion-compensator. The patterning device modulates a radiation beam. The projection system projects the modulated radiation beam onto a target portion of a substrate. The substrate position controller moves the substrate relative to the projection system sequentially through a plurality of exposure positions. The substrate-position-based expansion-compensator interacts with the substrate position controller to modify the exposure positions in order at least partially to compensate for thermally-induced geometrical changes of at least one of the substrate and projection system.

3 Claims, 5 Drawing Sheets

U.S. PATENT DOCUMENTS

| | | | |
|---|---|---|---|
| 5,808,797 A | 9/1998 | Bloom et al. | |
| 5,834,785 A | 11/1998 | Coon et al. | |
| 5,912,096 A | 6/1999 | Hada | |
| 5,953,106 A * | 9/1999 | Unno et al. | 355/55 |
| 5,982,553 A | 11/1999 | Bloom et al. | |
| 6,061,119 A | 5/2000 | Ota | |
| 6,088,080 A | 7/2000 | Itoh | |
| 6,133,986 A | 10/2000 | Johnson | |
| 6,177,980 B1 | 1/2001 | Johnson | |
| 6,373,619 B1 * | 4/2002 | Sandstrom | 359/298 |
| 6,377,334 B2 | 4/2002 | Whiting | |
| 6,416,913 B1 * | 7/2002 | Suzuki | 430/30 |
| 6,424,879 B1 | 7/2002 | Chilese et al. | |
| 6,654,660 B1 | 11/2003 | Singh et al. | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,909,588 B2 * | 6/2005 | Moffatt | 250/492.2 |
| 7,151,588 B2 * | 12/2006 | Franken et al. | 355/30 |
| 7,385,675 B2 | 6/2008 | George et al. | |
| 7,561,251 B2 | 7/2009 | Van Der Feltz et al. | |
| 2002/0146628 A1 | 10/2002 | Ota | |
| 2004/0012404 A1 | 1/2004 | Feder et al. | |
| 2004/0041104 A1 | 3/2004 | Liebregts et al. | |
| 2004/0084633 A1 | 5/2004 | Moffatt | |
| 2004/0130561 A1 | 7/2004 | Jain | |
| 2005/0007572 A1 | 1/2005 | George et al. | |
| 2005/0213067 A1 * | 9/2005 | Van Der Feltz et al. | 355/67 |
| 2007/0008531 A1 | 1/2007 | Smeets | |
| 2007/0026325 A1 | 2/2007 | Maria et al. | |
| 2007/0075315 A1 | 4/2007 | Venema et al. | |
| 2007/0257209 A1 * | 11/2007 | Ottens et al. | 250/492.3 |

FOREIGN PATENT DOCUMENTS

| | | |
|---|---|---|
| EP | 1 513 021 B1 | 10/2007 |
| GB | 2 321 316 A | 7/1998 |
| JP | 60-78454 A | 5/1985 |
| JP | 4-192317 A | 7/1992 |
| JP | 5-315222 A | 11/1993 |
| JP | 6-063948 A | 3/1994 |
| JP | 6-181168 A | 6/1994 |
| JP | 10-328732 A | 12/1998 |
| JP | 2004-363590 A | 12/2004 |
| WO | WO 97/14077 A1 | 4/1997 |
| WO | WO 98/33096 | 7/1998 |
| WO | WO 98/38597 | 9/1998 |
| WO | WO 00/72090 A2 | 11/2000 |

OTHER PUBLICATIONS

U.S. Appl. No. 11/175,033, filed Jul. 2005.
U.S. Appl. No. 11/192,400, filed Jul. 2005.
Third Notice of Allowance mailed Feb. 23, 2009 for U.S. Appl. No. 10/811,070, 6 pgs.
Sixth Non-Final Rejection mailed Oct. 31, 2008 for U.S. Appl. No. 10/811,070, 6 pgs.
Second Notice of Allowance mailed Sep. 25, 2008 for U.S. Appl. No. 10/811,070, 6 pgs.
Fifth Non-Final Rejection mailed Jun. 27, 2008 for U.S. Appl. No. 10/811,070, 8 pgs.
Notice of Allowance mailed Apr. 4, 2008 for U.S. Appl. No. 10/811,070, 4 pgs.
Second Final Rejection mailed Dec. 27, 2007 for U.S. Appl. No. 10/811,070, 6 pgs.
Fourth Non-Final Rejection mailed Jul. 26, 2007 for U.S. Appl. No. 10/811,070, 7 pgs.
Third Non-Final Rejection mailed Feb. 27, 2007 for U.S. Appl. No. 10/811,070, 6 pgs.
Final Rejection mailed Sep. 5, 2006 for U.S. Appl. No. 10/811,070, 9 pgs.
Second Non-Final Rejection mailed Mar. 13, 2006 for U.S. Appl. No. 10/811,070, 7 pgs.
Non-Final Rejection mailed Oct. 28, 2005 for U.S. Appl. No. 10/811,070, 7 pgs.
Response to Japanese Office Action (Notification of Reasons for Refusal) mailed Jun. 9, 2009 for Japanese Application No. 2005-092136, 4 pgs.
Notice of Reasons for Refusal for Japanese Patent Application No. 2006-272435 mailed Dec. 8, 2009, 4 pgs.
Translation of Office Action for Korean Application No. 10-2006-0097120 completed on Nov. 14, 2007, 5 pgs.
Translation of Office Action for Korean Application No. 10-2007-0048873 mailed Aug. 20, 2007, 8 pgs.
European Search Report for European Application No. 05251565.7 mailed on Jul. 25, 2005.

* cited by examiner

SYSTEM AND METHOD FOR COMPENSATING FOR RADIATION INDUCED THERMAL DISTORTIONS IN A SUBSTRATE OR PROJECTION SYSTEM

CROSS REFERENCE TO RELATED APPLICATIONS

This application claims benefit under 35 U.S.C. 119(e) to U.S. Provisional Patent Application No. 60/722,950, filed Oct. 4, 2005, which is incorporated by reference herein in its entirety.

BACKGROUND

1. Field of the Invention

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or which covers a portion of the width (for example half of the width). The substrate can be scanned underneath the exposure region, while the mask or reticle is synchronously scanned through the beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

The projection beam can transfer heat to the substrate and/or projection system during exposure, leading to thermal distortion. Distortion during exposure can reduce the quality of the image formed on the substrate (for example, reducing overlay accuracy between pattern layers and reducing critical dimension uniformity).

Therefore, what is needed are a system and method that reduce the consequences of radiation-induced thermal distortions during exposure.

SUMMARY

In one embodiment of the present invention, there is provided a lithographic apparatus comprising a patterning device, a projection system, a substrate position controller, and a substrate-position-based expansion-compensator. The patterning device modulates a radiation beam. The projection system projects the modulated radiation beam onto a target portion of a substrate. The substrate position controller moves the substrate relative to the projection system sequentially through a plurality of exposure positions. The substrate-position-based expansion-compensator interacts with the substrate position controller to modify the exposure positions in order at least partially to compensate for thermally-induced geometrical changes of at least one of the substrate and projection system.

In another embodiment of the present invention, there is provided a method of producing a compensated dose pattern for lithography comprising the following steps. Modeling an expected distortion to a pattern formed on a substrate by a radiation beam that has been modulated according to a desired dose pattern, the distortion arising due to the thermal effects that the modulated radiation beam would have on a projection system during projection. Calculating a compensated dose pattern to counteract the expected distortion, defined so that when the radiation beam is modulated according to the compensated dose pattern, the pattern formed on the substrate is closer to the desired dose pattern.

In a further embodiment of the present invention, there is provided a method of producing a compensated dose pattern for lithography comprising the following steps. Modeling an expected distortion to a pattern formed on a substrate by a modulated radiation beam that has been modulated according to a desired pattern, the distortion arising due to the thermal effects that the modulated radiation beam would have on the substrate when projected thereon. Calculating a compensated dose pattern to counteract the expected distortion, defined so that when the radiation beam is modulated according to the compensated dose pattern, the pattern formed on the substrate is closer to the desired dose pattern. The desired pattern to be formed on the substrate is defined relative to a plurality of reference points on the substrate. The modeling takes into account thermally-induced changes to the relative positions of the reference points and the compensated radiation beam is produced by interpolation between the reference points.

In a still further embodiment of the present invention, there is provided a lithographic apparatus comprising a patterning device, a projection system, a pattern controller, and a projection system temperature measurement system. The patterning device modulates a radiation beam. The projection system projects the modulated radiation beam onto a target portion of a substrate. The pattern controller modifies the modulation of the radiation beam in order at least partially to compensate for thermally-induced geometrical changes of at least one of the substrate and projection system. The projection system temperature measurement system measures the temperature of at least a portion of the projection system. The pattern controller is configured to modify the modulation of the radiation beam based on measurements from the temperature measurement system.

In yet another embodiment of the present invention, there is provided a lithographic apparatus comprising a patterning device, a projection system, and a pattern controller. The patterning device modulates a radiation beam. The projection system projects the modulated radiation beam onto a target portion of a substrate. The pattern controller modifies the modulation of the radiation beam in order at least partially to compensate for thermally-induced dimensional changes of at least one of the substrate and projection system. The pattern controller is configured to modify the modulation of the radiation beam as a function of the desired dose pattern.

In a still further embodiment of the present invention, there is provided a lithographic apparatus comprising a patterning device, a projection system, a pattern controller, and a substrate distortion measuring device. The patterning device modulates a radiation beam. The projection system projects the modulated radiation beam onto a target portion of a substrate. The pattern controller modifies the modulation of the radiation beam in order at least partially to compensate for thermally-induced geometrical changes of at least one of the substrate and projection system. The substrate distortion measuring device measures thermally-induced changes in the geometry of the substrate. The pattern controller is configured to modify the exposure positions on the basis of measurements from the distortion measuring device.

In an embodiment, there is provided a lithographic apparatus comprising a patterning device, a projection system, a pattern controller, and a projection system imaging error detector. The patterning device modulates a radiation beam. The projection system projects the modulated radiation beam onto a target portion of the substrate. The pattern controller modifies the modulation of the radiation beam in order at least partially to compensate for thermally-induced geometrical changes of at least one of the substrate and projection system. The projection system imaging error detector detects changes in the imaging properties of the projection system. The pattern controller is configured to modify the exposure positions on the basis of measurements from the imaging error determining device, for example, using the relative positions of at least two elements of the projection system.

In a still further embodiment of the present invention, there is provided a device manufacturing method comprising the following steps. Providing a patterning device capable of modulating a radiation beam. Providing a substrate table constructed to support a substrate. Providing a projection system configured to project the modulated radiation beam onto a target portion of the substrate. Providing a substrate position controller configured to move the substrate relative to the projection system sequentially through a plurality of exposure positions. Interacting with the substrate position controller to modify the exposure positions in order to at least partially compensate for thermally-induced geometrical changes of at least one of the substrate and projection system.

In yet another embodiment of the present invention, there is provided a device manufacturing method comprising the following steps. Providing a patterning device capable of modulating a radiation beam. Providing a substrate table constructed to support a substrate. Providing a projection system configured to project the modulated radiation beam onto a target portion of the substrate. Measuring the temperature of at least a portion of the projection system. Modifying the modulation of the radiation beam based on the temperature measurement in order to at least partially compensate for thermally-induced geometrical changes of at least one of the substrate and projection system.

In a yet further embodiment of the present invention, there is provided a device manufacturing method comprising the following steps. Providing a patterning device capable of modulating a radiation beam. Providing a substrate table constructed to support a substrate. Providing a projection system configured to project the modulated radiation beam onto a target portion of the substrate. Modifying the modulation of the radiation beam as a function of the desired dose pattern in order to at least partially compensate for thermally-induced geometrical changes of at least one of the substrate and projection system.

In another embodiment of the present invention, there is provided a device manufacturing method comprising the following steps. Providing a patterning device capable of modulating a radiation beam. Providing a substrate table constructed to support a substrate. Providing a projection system configured to project the modulated radiation beam onto a target portion of the substrate. Measuring thermally-induced changes in the geometry of the substrate. Modifying the exposure positions on the basis of the measurements in order to at least partially compensate for thermally-induced geometrical changes of at least one of the substrate and projection system.

In a still further embodiment of the present invention, there is provided a device manufacturing method comprising the following steps. Providing a patterning device capable of modulating a radiation beam. Providing a substrate table constructed to support a substrate. Providing a projection system configured to project the modulated radiation beam onto a target portion of the substrate. Providing a pattern controller configured to modify the modulation of the radiation beam in order to at least partially compensate for thermally-induced dimensional changes of at least one of the substrate and projection system. Detecting changes in the imaging properties of the projection system. Modifying the exposure positions on the basis of the detected changes.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
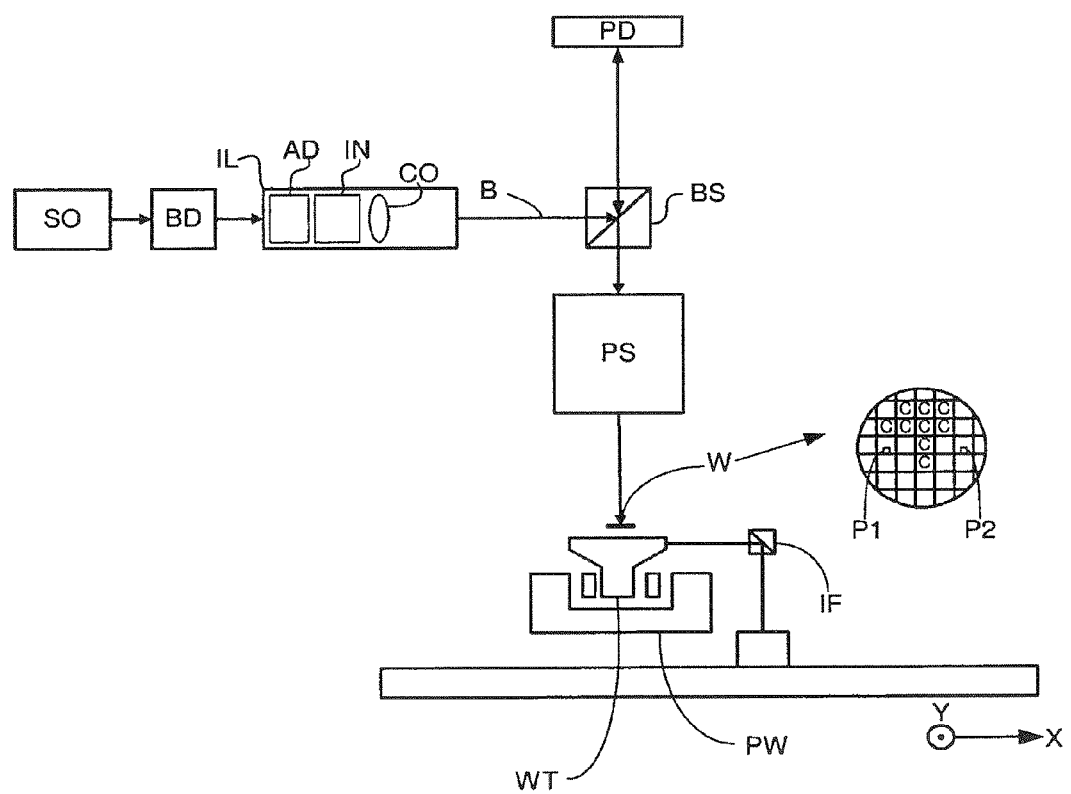
FIGS. 1 and 2 depict lithographic apparatus, according to various embodiments of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 schematically depicts the lithographic apparatus of one embodiment of the invention. The apparatus comprises an illumination system IL, a patterning device PD, a substrate table WT, and a projection system PS.

The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 μm, e.g., at least 100 μm, at least 200 μm, at least 300 μm, at least 400 μm, at least 500 μm, or at least 600 μm. In one example, the thickness of the substrate is at most 5000 μm, e.g., at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
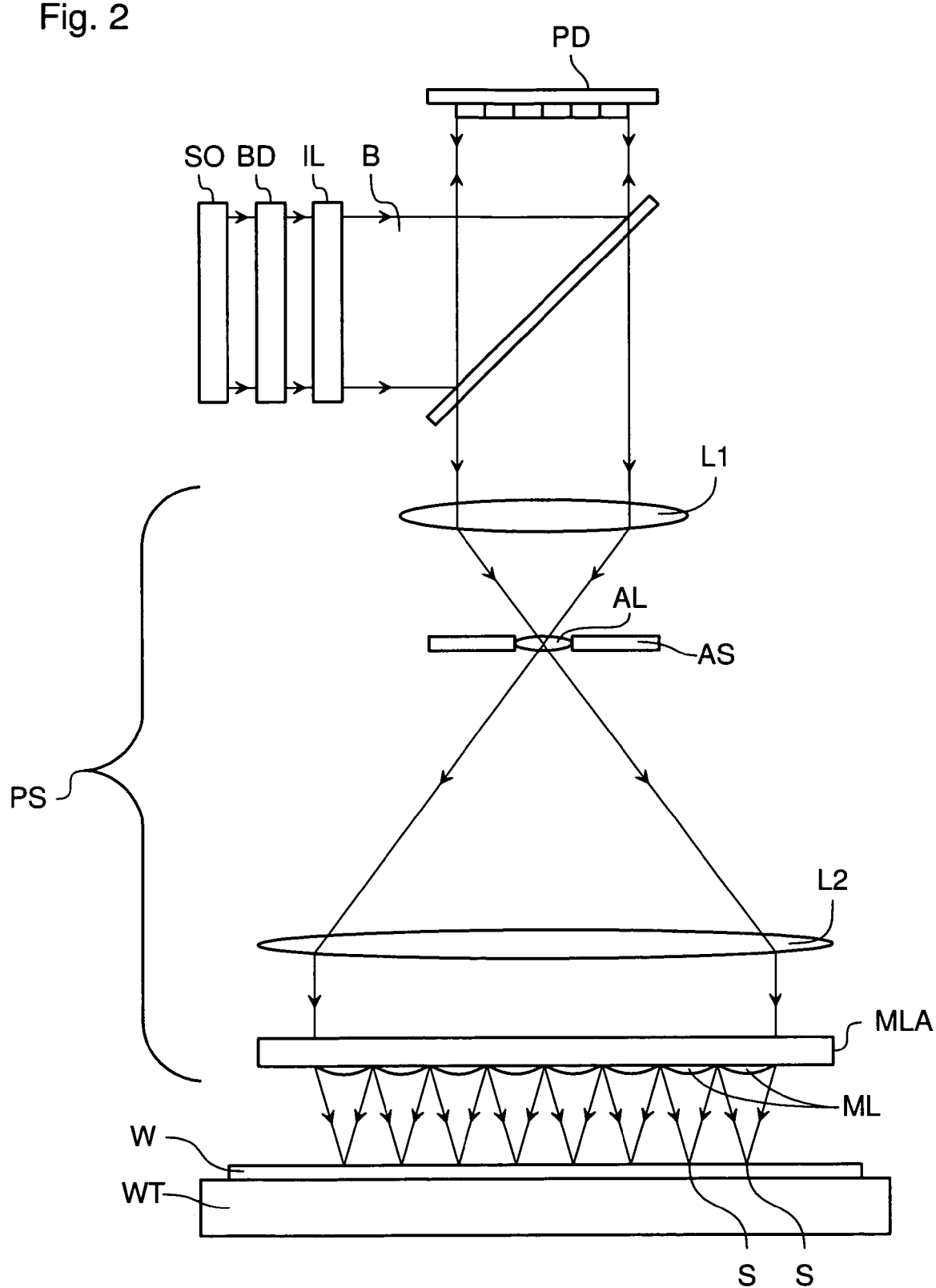

As herein depicted in FIGS. 1 and 2, the apparatus is of a reflective type (e.g., employing a reflective array of individually controllable elements).

Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These may be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
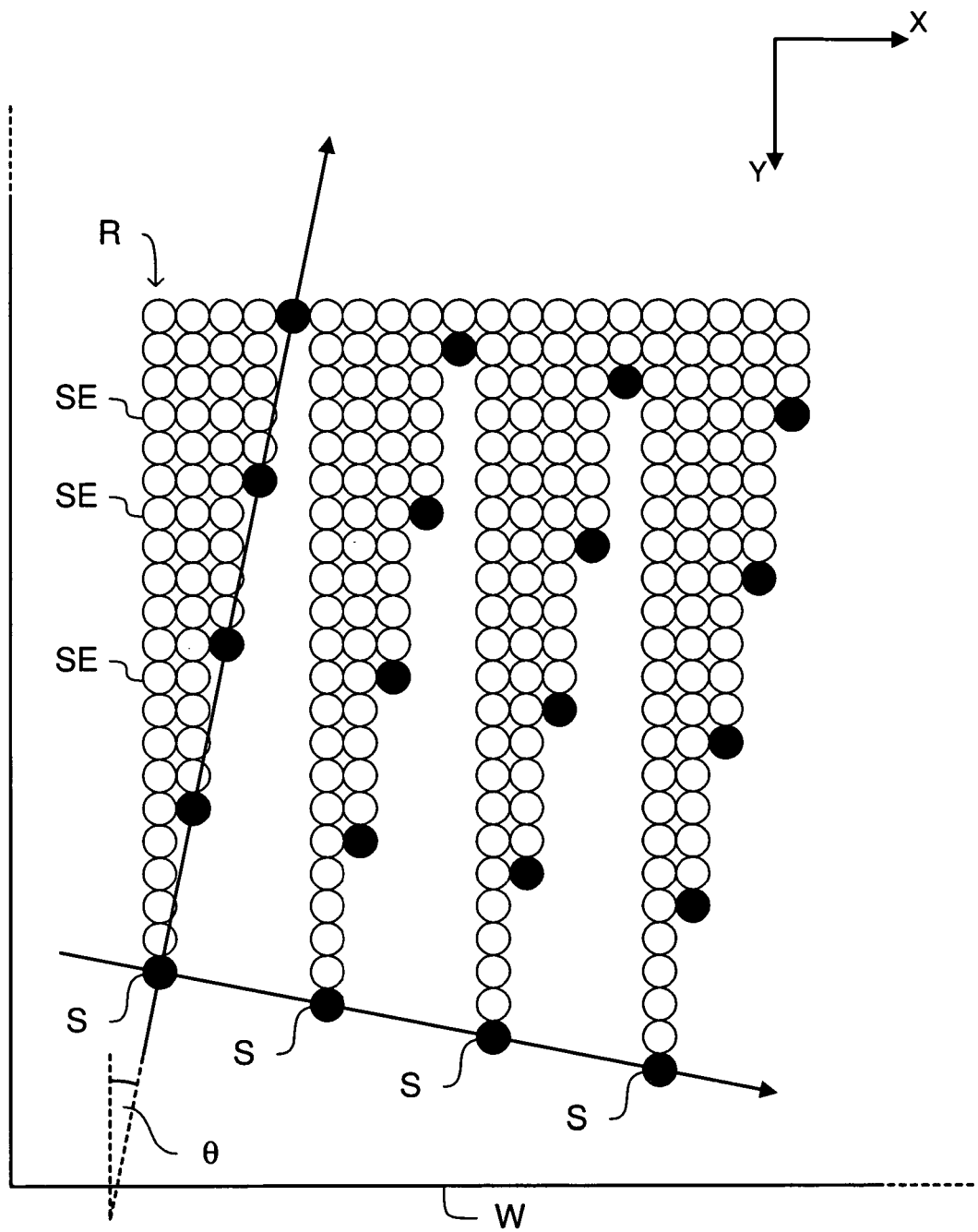
FIG. 3 depicts a mode of transferring a pattern to a substrate using an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

Figure 4:
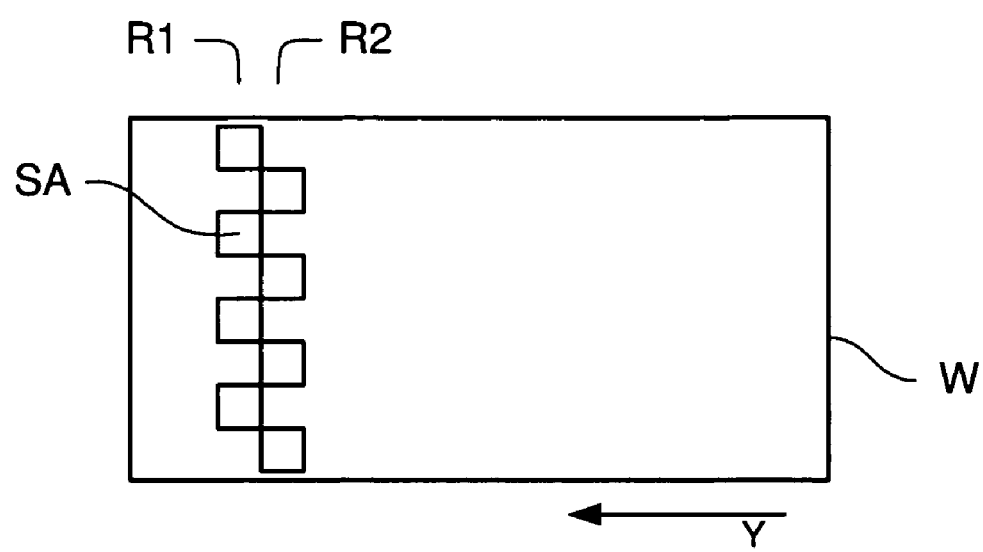
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots S slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Exposure radiation can cause heating of the substrate W and/or projection system PS during processing, leading to thermal distortions. For the substrate W, this can mean a change in geometry as it passes beneath the projection system PS compared to ambient temperature. This change in geometry can be referred to as a thermally-induced distortion or thermally-induced geometrical change, and will be understood to encompass any change in the form of the substrate that occurs due to thermal expansion of all or any part of it. For the projection system PS, such distortions can cause unwanted variations in optical properties, such as changes in magnification, or other optical errors. Here, thermally-induced distortion/geometrical change is to be understood to encompass any changes to the form of the projection system PS arising from thermal expansion, including any changes to any component of the projection system PS.

Thermal distortions will tend to reduce the quality of the pattern formed on the substrate W. For example, the pattern formed will be less close than it might otherwise be to a desired dose pattern in terms of alignment and/or critical dimension uniformity.

The magnitude and spatial distribution of the heating will depend on the requested dose pattern (e.g., the pattern geometry) and this will typically vary from one pattern layer on a substrate to the next. This means that the associated distortion can vary from layer to layer, leading to overlay problems, for example.

Figure 5:
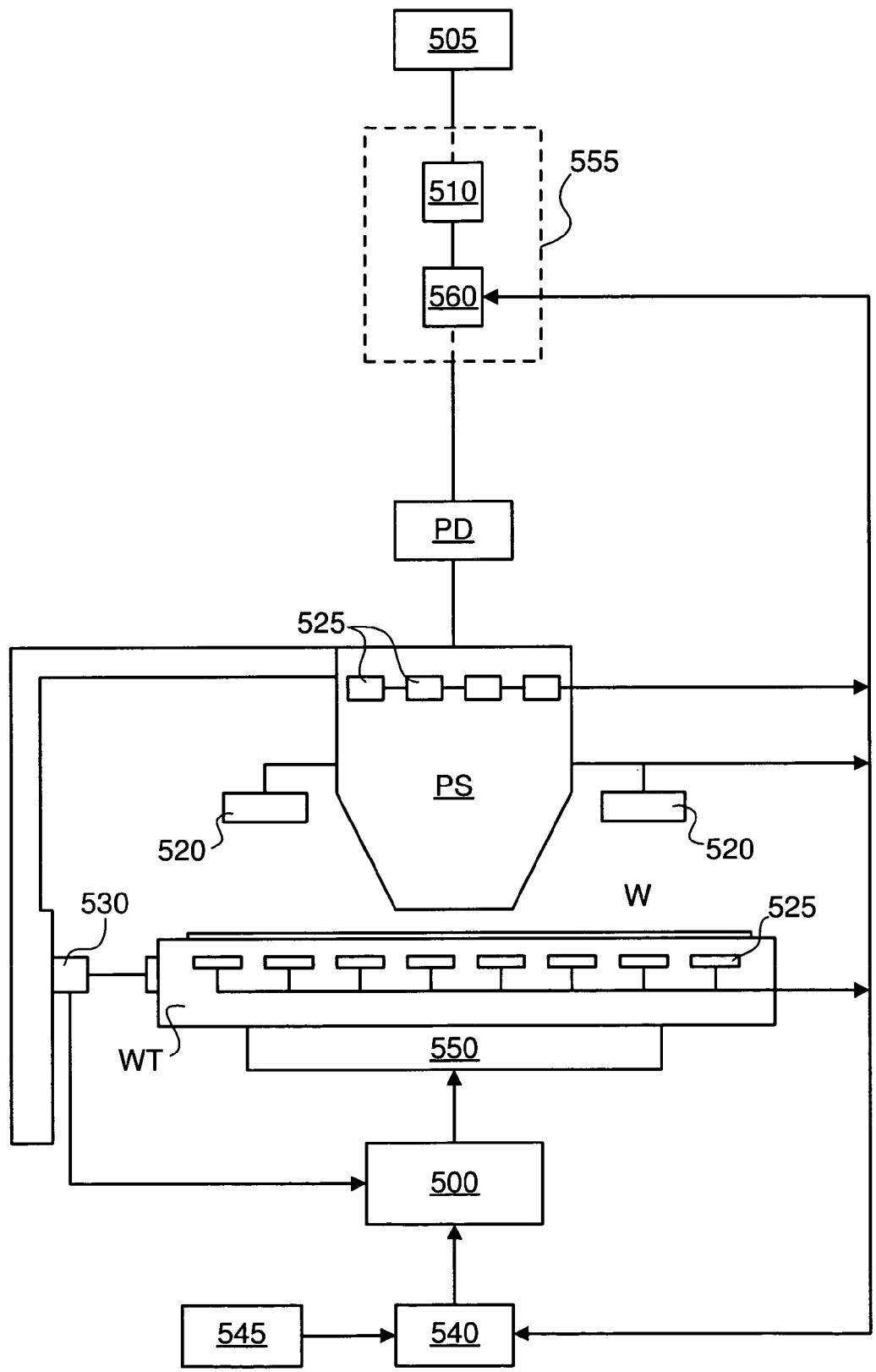
FIG. 5 depicts a lithographic apparatus comprising various embodiments of the invention for compensating substrate expansion during exposure.

FIG. 5 shows a number of different embodiments that can improve the accuracy with which a desired dose pattern, defined by a user via input device 505, for example, can be formed on a substrate W in the case where the substrate W and/or projection system PS is/are prone to heating and distortion. These embodiments can each be implemented separately or can be implemented in any combination.

In one example, a pattern is formed on the substrate W by exposure at different positions of the substrate W relative to the projection system PS. In this example, a substrate-position-based expansion compensator 540 can be provided to correct for thermal expansion of the substrate W and/or elements of the projection system PS by controlling the way the substrate W is moved. For example, the substrate-position-based expansion compensator 540 can be configured to interact with (e.g., provide corrections to) a substrate position controller 500 that is configured to control the general movement of the substrate W relative to the projection system PS.

For example, a substrate transport system 550 can be provided that is capable of moving the substrate table WT accurately through a sequence of exposure positions relative to the projection system PS. Each of the exposure positions represent positions of the substrate table WT at which exposure of the substrate W or a portion of the substrate W will occur. In the case where exposure is to be made continuously, these will represent positions at which exposure of a particular pattern from the patterning device PD is imparted to the substrate W. The substrate position controller 500 can comprise, for example, a closed-loop control system or servo system, with a feedback loop linked to a substrate position-measuring device 530 to achieve efficient convergence to each of the exposure positions. The substrate table WT can be made to move between discrete positions or be moved continuously in this manner.

In one example, the substrate-position-based expansion-compensator 540 can calculate how the exposure positions should be changed in order to compensate for the heating effects. The compensated exposure positions can then be supplied to the controller 500, which adjusts the motion of the substrate table WT accordingly.

In the example discussed above, the motion of the substrate W is controlled by adjusting the motion of the substrate table WT which supports it. However, alternative arrangements are possible that allow the substrate W to be moved relative to the projection system PS. For example, an apparatus could be provided to allow the substrate W to be moved relative to the substrate table WT, which itself could remain fixed relative to the projection system PS or also be moved. Additionally or alternatively, the projection system PS could be arranged to move relative to the substrate table WT and/or substrate W.

In one example, the substrate-position-based expansion-compensator 540 can calculate how to modify the exposure positions (or, more generally, how to modify the relative motion of the substrate W and projection system PS during exposure) on the basis of data associated with the temperature profile of the substrate W and/or projection system PS and data associated with the effects of the temperature profile (e.g. particular modes of distortion of the substrate W and/or components of the projection system PS and/or imaging errors of the projection system PS that occur due to the temperature profile).

For example, data relating to the temperature profile can be derived from measurements of the actual temperature taken at various points on or near the substrate W and/or relevant components of the projection system PS. This approach provides a reliable real time temperature distribution.

For example, temperature sensors 525 can be provided in the substrate table WT and/or projection system PS to determine a temperature profile of either or both of these components. Thermocouple arrays and/or thermographic sensors can be used, for example. This temperature profile can be used to calculate an expected distortion from a predictive model, for example.

In various examples, the readings from the temperature sensors 525 are forwarded during exposure either to the substrate-position-based expansion-compensator 540, to a control-signal-based expansion-compensator 560, or to both. Relevant corrections are calculated according to the model.

Additionally or alternatively, an expected temperature distribution can be derived from a desired dose pattern by analyzing the expected heat flow in the exposure process, for example up to and including the stage of exposure of interest. This approach avoids having to provide temperature sensors and the calculations can be carried out offline as well as online.

In one example, data relating to the distortion and/or imaging error of the projection system PS can be derived from the temperature distribution (obtained either by measurement or by modeling the heating effects of a particular desired dose pattern) using an associated predictive model (e.g., a mathematical model that provides the required output based the temperature distribution/profile, which should be provided as input). This approach avoids having to measure thermal distortions directly and the calculations can be carried out offline as well as online. Alternatively or additionally, the predictive model can take the desired dose pattern as input directly and can include an additional internal calculation step that converts the desired dose pattern to an expected temperature distribution. Predictive models can remove or reduce the need for calibration measurements and/or tables.

For example, a predictive model can be constructed that predicts a magnification change of the optics (or other change in the imaging properties of the projection system PS) based on the requested dose pattern and the thermal, optical and/or mechanical properties of the apparatus design.

Alternatively, the distortion of the substrate W due to heating can be predicted from the desired dose pattern, expose scan details and thermal and/or mechanical properties of the substrate table WT and/or substrate W.

Alternatively or additionally, the substrate W distortion and/or projection system PS imaging error data can be derived from calibration data (which can be stored in a memory device 545, for example). In one example, the calibration data is derived from control experiments and provides a link between the temperature distribution and/or desired dose pattern and the expected distortion and/or imaging error. In another example, the calibration data relates substrate temperature measurements to corresponding substrate geometries. These control experiments can consist of measuring the distortion and/or imaging error for a number of different temperature distributions of the substrate W and/or projection system PS and/or desired dose patterns, for example. The type of calibration can be chosen according to what is considered the most convenient data to use as input. The use of calibration data ensures reliable compensation. A high frequency calibration map (i.e. a calibration table with a high density of entries) can be used to provide accurate compensation. Therefore, compensation can be accomplished, in an embodiment, by modifying the position the substrate based on temperature measurements and calibration data.

In one example, a combination of a purely theoretical predictive model and calibration experiments can also be used. For example, parameters such as thermal capacitances, thermal resistivities, and effective thermal expansion coefficients in the theoretical model can be adjusted (e.g., tuned) to match the experiments.

Alternatively or additionally, a distortion measuring device 520 can be provided that is capable of measuring deformation of the substrate W and/or projection system PS directly. For example, sensors can be provided that measure the position and/or orientation of markers formed on the substrate W. The positions and/or orientations of the markers can be measured relative to the projection system PS, relative to each other, relative to a reference frame of the lithographic apparatus, or to any combination of these.

In one example, the changes in the imaging properties of the projection system PS can be measured by a distortion measuring device 520 using radiation of a secondary wavelength (to which a resist on the substrate W is not sensitive). For example, an image that is indicative of one or more particular imaging characteristics of the projection system PS can be formed, using the secondary radiation, based on features on the substrate W. Radiation spot position deviations can be measured. This can also be carried out offline, for example, by replacing the substrate W with a suitable detector.

Alternatively or additionally, an apparatus can be provided for measuring the physical state of elements of the projection system. For example, the relative separation of different elements of the projection system PS can be determined, from which the extent and/or nature of imaging errors can be derived. Where the imaging properties are sensitive to mechanical stresses (e.g., caused by thermal effects), stress sensors can also be included. Where a microlens array is used in the projection system PS, the positions and orientations of individual mirrors can be measured relative to each other and/or relative to a reference frame of the lithographic apparatus.

In one example, data representing the distortion determined by the distortion measuring device 520 can be forwarded during exposure either to the substrate-position-based expansion-compensator 540, to the control-signal-based expansion-compensator 560, or to both. Relevant corrections can then be made.

The distortion measuring device 520 can be used offline to generate calibration data to link thermally-induced distortions with the desired dose pattern. For example, the distortion of the whole or a portion of the substrate W and/or projection system PS and/or projected image can be measured at one or various positions as a "calibration pattern" with particular properties is formed on a substrate W. The procedure can be repeated for a range of "calibration patterns" with different properties. Several possible approaches exist for how best to use the resulting calibration data to determine the expected thermal effects of an actual desired dose pattern. One approach would be to identify the calibrated pattern that has characteristics closest to that of the desired dose pattern and use the corresponding calibration data as the basis for estimating thermally-induced distortions. Alternatively or additionally, the desired dose pattern can be mathematically "decomposed" or "expanded" into a number of calibration patterns (here used as basis functions) that are weighted so that their sum best represents the requested dose pattern. The calibration data associated with each of the calibration patterns forming the desired dose pattern are then combined according to the appropriate weightings in order to estimate the thermally-induced distortions. This approach can be more computationally intensive than the former method, but can achieve a closer fit to the real thermal effects. The use of calibration data based on calibration patterns that are similar (or which can be combined to produce something similar), but not identical to the desired dose pattern allows a high degree of correction at reasonable cost. This can be because it is not necessary to carry out a calibration run each time the pattern to be formed on the substrate is changed.

Alternatively or additionally, calibration experiments can be carried out using the distortion measuring device 520 to determine a relationship between the distortion of the substrate W and/or projection system PS and the temperatures measured by the temperature sensors 525. The compensators 540 and 560 can be able to determine the distortion more cheaply and quickly online by referring to the results of these calibration measurements and temperature measurements than might be possible using the distortion measuring device 520 on its own.

In another example, the approach of adjusting the motion of the substrate W to correct for thermal distortions is particularly effective for corrections parallel to the predominant scanning direction (i.e., along the Y axis in the present example) due to the cumulative nature of expansion along the scanning direction. For each point along Y, the positional error due to expansion will depend on the expansion of all previously exposed points. Those that have the most influence can be those that lie along the same line (of constant X) and/or on neighboring lines. For example, this can mean that as more of the substrate W is exposed along Y, the positional error of points in this direction will increase. The actual expansion observed can depend on a number of other factors such as how the substrate W is supported and/or clamped as well as the thermal properties of the radiation, substrate W and substrate table WT etc., which can be taken into account.

Overall, a significant level of compensation can be achieved by adjusting the position/movement of the substrate W, and the process can be implemented relatively easily and economically because it does not require expensive additional hardware or substantial modifications to existing hardware.

In one example, components of thermal expansion parallel to the X-axis (i.e., along lines of constant Y) may not be corrected quite so easily using this approach. These components depend also on how other regions along the same line or neighboring lines have been distorted. However, because portions of the pattern along the same line of constant Y tend to be exposed over a very short time interval (and not, generally, from one end of the line to the other) the thermal expansion tends to be quite different for different points along the line. If there is an imbalance in incident energy, it is possible that a net movement of the substrate W along X will occur, but correcting X components by adjusting the movement of the substrate W can be less effective than for the Y components.

In one example, the cumulative nature of the corrections along Y can mean that these are most conveniently compensated by adjusting the relative position/movement of the substrate W.

In one example, components of the thermal distortion parallel to the X-axis can be more conveniently dealt with by adapting the pattern imparted by the patterning device PD. This can even be achieved inline (i.e., in "real time" during exposure) for corrections parallel to the X-axis, as may not be necessary to consider the dose from remote parts of the pattern in the same way as for distortion components parallel to Y. This can mean that the amount of data to be considered when calculating an expected distortion (along X) is much smaller and can be made more easily available to the relevant components of the datapath 555 (e.g., it can all be held in a buffer long enough for the calculations to be completed). For corrections along Y, a greater amount of data has to be processed, which can make the process more onerous and expensive.

Therefore, an effective compensation strategy can be to combine substrate-position-based compensation for dealing with the Y-axis corrections only with control-signal-based compensation for dealing with the X-axis corrections only. It is to be understood, however, that substrate-position-based and control-signal-based compensation can both be implemented simultaneously for distortion components along both X and/or Y in any combination. Where both methods are used for the same distortion components, substrate-position-based compensation can be used as a coarse correction with a control-signal-based correction being used as a fine correction and vice versa.

The "Y-axis" referred to above is to be understood as any axis parallel to a predominant scanning direction. A Y coordinate can be defined relative to a number of possible origins, which can be fixed relative to different reference frames. For example, that of the projection system PS or substrate W. For example, the Y coordinate can be measured from a point on the substrate W that is exposed first (for a given scan), or from one edge of the exposure slit (which represents an area beneath the projection system PS which can be exposed at a given time).

In the case where an array of individually controllable elements is used as a patterning device PD, the pattern to be formed on the substrate W can be built up from an array of spot exposures, the intensity or dose associated with each of the spot exposures being modulated to define the desired dose pattern. The array of individually controllable elements is controlled by a control signal provided by the "datapath" hardware 555 (also referred to as the "data processing system," which derives the control signal by converting a representation of a desired dose pattern provided by the user). Normally, the center positions of the array of spot exposures are arranged to form a uniform grid (for example, with square or hexagonal symmetry) on the substrate W as it moves under the projection system PS. As explained below, the grid actually formed can become distorted relative to the imaged grid due to thermal contraction as the substrate W cools after exposure.

According to one embodiment of the invention, a control-signal-based expansion-compensator 560 is provided that adapts the control signal to be supplied to the patterning device PD in order at least partially to compensate for substrate expansion and/or imaging errors caused by thermal expansions in the projection system PS. Such thermal expansion can occur in a direction substantially parallel to a first axis, or in another embodiment, in a direction perpendicular to the first axis. The compensation can be performed via an interpolation algorithm, which converts between the required dose values calculated for an undistorted substrate W and the dose values that are required to produce the same pattern (after cooling back to ambient temperature, for example) in the case when the substrate W is thermally distorted as it passes beneath the projection system. In one example, the compensator 560 can be configured to adapt an uncompensated control signal output by a data manipulation device 510. As in the embodiments and/or examples discussed above, this method is based on information about how the substrate W and/or projection system PS deform during exposure. The information can be obtained as described above by measurements and/or calculations of expected temperature profiles of the substrate W and/or projection system PS and/or measurements and/or calculations of the associated thermally-induced distortions.

As mentioned above, the center positions of an array of spot exposures that are imaged when the substrate W is in a partially heated state will constitute a "distorted grid" once the substrate W has cooled. The requested dose pattern, however, can be defined relative to an "undistorted grid," which corresponds to the center positions of the array of spot exposures in the theoretical situation where the substrate W does not change shape (this is the case when expressed as an "uncompensated control signal" by data manipulation device 510, for example). The interpolation algorithm acts to determine, for each of the positions in the distorted grid, what exposure dose is required to reproduce the requested dose pattern defined relative to the undistorted grid.

Another alternative or additional approach is to model the expected thermal distortion to a pattern formed on a substrate W due to the thermal effects of the modulated radiation beam on the projection system PS and/or substrate W, and produce a compensated dose pattern that counteracts these thermal effects. The compensated dose pattern can then be supplied as input to the lithography device in the place of the desired dose pattern without changing any of the hardware intrinsic to the lithographic apparatus. The compensated dose pattern will be slightly different to the desired dose pattern because it is designed to take account of the thermally-induced distortion that occurs during imaging. However, the pattern finally formed on the substrate W (for example, after it has cooled back to ambient temperature) will be closer to the desired dose pattern than would otherwise be the case.

Where the desired dose pattern is defined relative to a plurality of reference points on the substrate W, the offline modeling can take into account the thermally-induced changes to the relative positions of the reference points. For example, where the desired dose pattern is defined relative to a grid of spot exposures or pixels, the modeling can take into account how the positions of each of the spot exposures or pixels changes due to thermal effects. Interpolation can be used to determine how best to form the desired dose pattern taking into account the new positions of the reference points. For example, interpolation can be carried out at the new positions between the desired dose pattern defined relative to the old reference point positions. The relative positions of the reference points can be defined relative to each other, relative to the projection system PS, or relative to some other frame of reference.

The modeling process can take account of the same factors as the predictive models discussed above. These factors can include details of the energy flow associated with the desired dose pattern and the thermal, mechanical and optical properties of the elements concerned (for example, the substrate W, substrate table WT, clamping elements etc.). Modal parameters can be measured experimentally.

In one example, FIG. 5 shows a substrate-position-based expansion compensator 540 and a control-signal-based expansion compensator 560, but either one of these can also be implemented in isolation. The control-signal-based expansion compensator 560 can also be referred to more generally as a pattern controller, its general function being to modify the way in which the radiation beam is modulated in order to carry out its compensating function.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g. semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all emplary embodiments of the present invention as contemplated by the inventor(s), and thus, are not intended to limit the present invention and the appended claims in any way.

What is claimed is:

1. A lithographic apparatus, comprising:
    a modulation system configured to emit a modulated radiation beam;
    a projection system configured to project the modulated radiation beam onto a target portion of a substrate;
    a substrate position controller configured to move the substrate relative to the projection system;
    a temperature measurement system configured to measure a temperature of the projection system;
    a substrate-position-based expansion-compensator coupled to the substrate position controller and together configured to modify a position of the substrate relative to the projection system based on measurements from the temperature measurement system; and
    a conversion system configured to convert a first representation of a desired dose pattern into a control signal configured to control the modulation system, the conversion system comprising a control-signal-based expansion-compensator configured to adapt the control signal to at least partially compensate for thermal expansion of the projection system and the substrate by generating a compensated dose pattern produced by the modulation system.

2. The lithographic apparatus of claim 1, wherein the substrate-position-based expansion-compensator modifies the position of the substrate based on an effect on the projection system caused by the temperature.

3. The lithographic apparatus of claim 1, wherein:
the substrate position controller moves the substrate in a direction substantially parallel to a first axis; and
the substrate-position-based expansion-compensator modifies an exposure position in a direction parallel to the first axis.

* * * * *